US010638596B2

(12) United States Patent
Kegeler

(10) Patent No.: US 10,638,596 B2
(45) Date of Patent: Apr. 28, 2020

(54) MULTI-LAYER PRINTED CIRCUIT BOARD HAVING A PRINTED COIL AND METHOD FOR THE PRODUCTION THEREOF

(71) Applicant: Schaeffler Technologies AG & Co. KG, Herzogenaurach (DE)

(72) Inventor: Jörg Kegeler, Schleusingen (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 0 days.

(21) Appl. No.: 15/770,504

(22) PCT Filed: Nov. 9, 2016

(86) PCT No.: PCT/DE2016/200512
§ 371 (c)(1),
(2) Date: Apr. 24, 2018

(87) PCT Pub. No.: WO2017/080554
PCT Pub. Date: May 18, 2017

(65) Prior Publication Data
US 2018/0317313 A1    Nov. 1, 2018

(30) Foreign Application Priority Data
Nov. 13, 2015   (DE) ..................... 10 2015 222 400

(51) Int. Cl.
*H05K 1/02* (2006.01)
*H01F 41/04* (2006.01)
(Continued)

(52) U.S. Cl.
CPC ....... *H05K 1/0206* (2013.01); *H01F 27/2804* (2013.01); *H01F 27/2876* (2013.01);
(Continued)

(58) Field of Classification Search
CPC ............ H01F 17/0013; H01F 17/0033; H05K 1/0204; H05K 1/0206; H05K 1/0207; H05K 1/2098; H05K 3/46; H05K 3/4611; H05K 3/4626; H05K 3/4629; H05K 3/4632; H05K 3/4635; H02K 33/00; H02K 33/18; H02K 2203/03
USPC ...................................... 310/DIG. 6, 15, 17
See application file for complete search history.

(56) References Cited

U.S. PATENT DOCUMENTS 4,314,295 A * 2/1982 Frandsen ........... H02K 41/0356
310/13
4,547,961 A    10/1985 Bokil
(Continued)

FOREIGN PATENT DOCUMENTS

DE    102008062575 A1    6/2010
EP         2525632 A1   11/2012

*Primary Examiner* — Burton S Mullins
(74) *Attorney, Agent, or Firm* — Kevin L. Parks

(57) ABSTRACT

Multi-layer printed circuit boards and methods of producing the same are disclosed. In one example, a multi-layer printed circuit board may include flat coils which are situated vertically one above the other and are connected electrically in series or in parallel in order to form a first solenoid coil. Two vertically adjacent flat coils may be arranged laterally offset in relation to one another in such a way that conductor track sections of one flat coil are arranged so as to vertically partially overlap with two conductor track sections of the other flat coil in a cross section perpendicular to a surface of the multi-layer printed circuit board.

8 Claims, 3 Drawing Sheets

(51) Int. Cl.
    *H02K 33/18*   (2006.01)
    *H01F 27/28*   (2006.01)
    *H05K 1/16*    (2006.01)
    *H05K 3/42*    (2006.01)
(52) U.S. Cl.
    CPC .......... *H01F 41/041* (2013.01); *H02K 33/18* (2013.01); *H05K 1/0204* (2013.01); *H05K 1/0207* (2013.01); *H05K 1/165* (2013.01); *H05K 3/429* (2013.01); *H01F 2027/2809* (2013.01); *H05K 1/0298* (2013.01); *H05K 2201/066* (2013.01); *H05K 2201/09227* (2013.01); *H05K 2201/09672* (2013.01); *H05K 2201/09709* (2013.01); *H05K 2201/09781* (2013.01)

(56) References Cited

U.S. PATENT DOCUMENTS

| | | | | |
|---|---|---|---|---|
| 5,760,502 A * | 6/1998 | Van Loenen | ............ | H02K 3/26 29/846 |
| 5,831,331 A * | 11/1998 | Lee | .................. | H01L 23/645 257/659 |
| 6,160,327 A * | 12/2000 | Wang | ..................... | H02K 3/26 310/12.02 |
| 6,480,086 B1 * | 11/2002 | Kluge | ................. | H01F 17/0013 257/E21.022 |
| 6,664,664 B2 * | 12/2003 | Botos | ...................... | H02K 3/26 310/12.22 |
| 7,486,168 B2 * | 2/2009 | Kim | ................... | H01F 17/0013 336/200 |
| 7,489,218 B2 * | 2/2009 | Lee | ..................... | H01F 17/0006 336/84 C |
| 7,808,356 B2 * | 10/2010 | Papananos | .......... | H01F 27/2804 336/200 |
| 8,143,986 B2 * | 3/2012 | Tanabe | ................ | H01L 23/5227 336/200 |
| 8,482,929 B2 * | 7/2013 | Slaton | .................. | H05K 1/0206 174/252 |
| 9,048,017 B2 * | 6/2015 | Kireev | ..................... | H03F 3/04 |
| 2009/0283299 A1 | 11/2009 | Suzuki | | |
| 2015/0130579 A1 * | 5/2015 | Kim | ................... | H01F 27/2804 336/200 |

\* cited by examiner

MULTI-LAYER PRINTED CIRCUIT BOARD HAVING A PRINTED COIL AND METHOD FOR THE PRODUCTION THEREOF

CROSS-REFERENCE TO RELATED APPLICATIONS

This application is the U.S. National Phase of PCT Appln. No. PCT/DE2016/200512 filed Nov. 9, 2016, which claims priority to DE 102015222400.7 filed Nov. 13, 2015, the entire disclosures of which are incorporated by reference herein.

TECHNICAL FIELD

The disclosure relates to a multi-layer printed circuit board having a solenoid coil which is formed from flat coils which are situated one above the other and also to a method for the production thereof.

BACKGROUND

A multi-layer printed circuit board is intended to be understood to mean a printed circuit board which has a plurality of planes which are situated vertically one above the other and which are each fitted with conductor tracks. The conductor tracks which are arranged on the various planes can be electrically connected to one another by means of so-called vias. These vias, also called electrical plated through-holes, are generally realized by a vertical bore which is metallized over its inside diameter.

By way of example, DE 10 2008 062 575 A1 discloses a multi-layer printed circuit board. Said document discloses a linear motor, the primary part of which is in the form of a multi-layer printed circuit board. The various layers of this multi-layer printed circuit board are for the most part filled with turns which can be energized. Turns which are situated one above the other in each case form a coil of a phase of the linear motor. A particularly lightweight and compact primary path for a linear motor, which primary path is particularly suitable as a rotor for highly dynamic applications, can be realized in this way.

FIG. 1 shows an arrangement of flat coils 1-6 for forming a solenoid coil in a cross section 8 perpendicular to the surface of a multi-layer printed circuit board. In said figure, by way of example, a flat coil 1-6 with in each case three turns which run in a spiral manner either from the inside to the outside or from the outside to the inside is located in each of the planes of the multi-layer printed circuit board. By way of example, a first flat coil 1 is wound from the outside to the inside and is electrically connected to a second flat coil 2, which is situated beneath it, by means of an electrical via. The second flat coil 2 is, in turn, wound from the inside to the outside in a spiral manner and for its part is once again connected to a third flat coil 3 in the third plane of the multi-layer printed circuit board by means of a further electrical via, not illustrated here. A solenoid which extends over six planes of the multi-layer printed circuit board is created in this way.

Multi-layer printed circuit board technology is also particularly suitable for realizing applications with high electrical power in a compact and lightweight design. An example of this is the abovementioned primary part of the linear motor from DE 10 2008 062 575 A1 which is realized as a multi-layer printed circuit board. Owing to the high currents in applications of this kind, the removal of heat is a particular challenge here. Therefore, it is necessary, for example—as illustrated in FIG. 1—to route the heat produced in the inner conductor tracks laterally to the outer printed circuit board edge where it can then be discharged to the surface of the printed circuit board. An insulating gap which can be of the order of magnitude of a few hundred micrometers is to be provided between the individual conductor tracks of a turn of each flat coil. The electrical insulation is ensured, for example, by prepreg layers, but the thermal conductance of said prepreg layers is low. Accordingly, a particular challenge is to discharge the heat from the central region of a multi-layer printed circuit board of this kind.

SUMMARY

The disclosure is based on the object of improving the removal of heat from coils which are realized in the form of a multi-layer printed circuit board.

This object may be achieved by a multi-layer printed circuit board having the features disclosed herein. The object is also achieved by a method for producing a solenoid coil on a multi-layer printed circuit board as disclosed herein. Additional embodiments of the disclosure are also disclosed.

The multi-layer printed circuit board according to the disclosure comprises a plurality of flat coils which are situated vertically one above the other. The flat coils are applied, for example, initially to a plurality of individual printed circuit boards, wherein the individual printed circuit boards are preferably stacked one above the other in order to form the multi-layer printed circuit board. In each case one flat coil is preferably arranged on the top side and also on the bottom side on each individual printed circuit board. In this way, two individual printed circuit boards which are stacked one on the other form a stack of a total of four flat coils, wherein the individual printed circuit boards which are stacked one on the other are preferably separated from one another by an insulating layer, for example a prepreg layer.

According to the disclosure, the flat coils which are situated vertically one above the other are connected electrically in series. This can preferably be implemented using electrical plated through-holes, also called vias. The flat coils which are connected electrically in series form the first solenoid coil according to the disclosure. Each individual flat coil is preferably wound in a spiral manner in its respective plane. Therefore, by way of example, a first flat coil, which is located in the top layer of the multi-layer printed circuit board for example, runs in a spiral manner from the inside to the outside in the plane of the multi-layer printed circuit board. In contrast, a second flat coil which is arranged beneath the first flat coil as viewed in the vertical direction of the printed circuit board runs in a spiral manner from the outside to the inside.

In this context, a spiral profile of the turn is intended to be understood as any kind of winding in which the individual turns of the flat coil are formed by a single planar conductor track and are enclosed in one plane. Here, the conductor track routing can be characterized by rounded portions, but can also run in an angular manner.

The disclosure is now based on the finding that the thermal conductance of the multi-layer printed circuit board—in particular in the lateral direction—can be considerably improved when in each case two vertically adjacent flat coils are arranged laterally offset in relation to one another in such a way that conductor track sections of one flat coil are arranged vertically so as to partially overlap with two conductor track sections of the other flat coil in a cross section perpendicular to the surface of the multi-layer printed circuit board. In this way, the heat which is produced in an inner turn of one flat coil can be very easily transferred to a turn of a vertically and laterally adjacent flat coil which, as viewed in the lateral direction, is closer to the edge of the printed circuit board. This is because the insulating gap between the conductor track sections which are located so as to vertically partially overlap can, for technical reasons, be realized to be considerably smaller than the insulating gap between two turns which are arranged in the same plane of the conductor track printed circuit board.

For technical reasons, the distance between two turns in one plane between the conductor track sections in question cannot be chosen to be as small as desired. However, the individual printed circuit boards of the multi-layer printed circuit board can be electrically insulated from one another by a comparatively thin prepreg layer. This prepreg layer can be reduced, for example, to the region of only 40 µm in order to ensure adequate electrical insulation, whereas the conductor track distance between the individual turns cannot be chosen to be smaller than 200 µm for technical reasons.

Accordingly, the heat transfer between conductor track sections of vertically adjacent flat coils which are located so as to partially vertically overlap is considerably better than between two conductor track sections of different turns of the flat coil which are arranged in the same plane.

The lateral offset according to the disclosure of the flat coils which are situated one above the other has the result that conductor track sections pass through the cross section over its entire lateral extent. The transfer of heat between two conductor track sections takes place mainly in the vertical direction where, on account of the small insulating gap, a relatively small thermal resistance prevails. This has the result that the lateral thermal conduction within the multi-layer printed circuit board is ensured almost in the same way as with an uninterrupted metal layer through the entire printed circuit board.

A particularly low thermal resistance can be implemented between two vertically adjacent flat coils, the turns of which are connected electrically in parallel. In this case, said turns of the two vertically adjacent flat coils have to be separated only by a very thin prepreg layer, for example with a thickness of between 20 and 40 µm. Excellent transfer of heat between the conductor track sections in question which are arranged so as to partially overlap in relation to one another can be realized given the low thickness of the insulation layer used between the adjacent flat coils owing to the lateral offset according to the disclosure of these adjacent flat coils.

A design of the disclosure in which the flat coils which are arranged on individual layers, one of which flat coils is located on the top side and one of which flat coils is located on the bottom side of the individual layer in each case, are connected electrically in series while two vertically adjacent flat coils which are associated with two different conductor track carriers are connected electrically in parallel is particularly advantageous. In this way, a small insulation gap can be realized in a very simple manner by choosing a correspondingly thin prepreg layer between the two vertically adjacent flat coils which are associated with separate individual printed circuit boards.

The multi-layer printed circuit board according to the disclosure already considerably improves the removal of heat from only one single solenoid coil which is arranged on the printed circuit board. However, in many applications, it is expedient to arrange a plurality of solenoid coils on the multi-layer printed circuit board. This is the case, for example, in a linear motor which has a primary part, which is in the form of a multi-layer printed circuit board according to one of the embodiments described here, and a secondary part, which has permanent magnets and is spaced apart from the primary part by means of an air gap.

Therefore, one embodiment of the disclosure includes that the multi-layer printed circuit board has at least one second solenoid coil which is arranged laterally offset in relation to the first solenoid coil, wherein outer conductor track sections of flat coils of the second solenoid coil engage in a comb-like manner into outer conductor track sections of the flat coils of the first solenoid coil, so that in each case one outer conductor track section of the second solenoid coil is arranged so as to vertically partially overlap with at least one outer conductor track section of the first solenoid coil in said cross section. Therefore, a shingle-like arrangement of the conductor track sections in said cross section is also continued beyond the coil boundaries.

An outer conductor track section of the first solenoid coil partially overlaps with an outer conductor track section of the second solenoid coil, possibly also with two outer conductor track sections of this kind of the second solenoid coil. The heat which is introduced into the outer conductor track section of the first solenoid coil can therefore be transferred to the outer conductor track section or the outer conductor track sections of the second solenoid coil in a vertical direction across a comparatively small insulating gap. In this way, the transportation of heat can be transferred into the outer edge region of the multi-layer printed circuit board in the lateral direction from the central inner region of the multi-layer printed circuit board in an outstanding manner even beyond coil boundaries, in a similar way as would be the case with a solid metal plate.

The heat which is produced in the solenoid coil or solenoid coils of the multi-layer printed circuit board can advantageously be routed to one or both surfaces of the multi-layer printed circuit board if the multi-layer printed circuit board has a passive conductor track structure which is DC-isolated from all of the current-carrying conductor tracks of the multi-layer printed circuit board, is arranged laterally offset in relation to the first solenoid coil and engages in a comb-like manner into the outer conductor track sections of the flat coils of the first solenoid coil. Therefore, a kind of shingle-like overlapping of conductor track sections is also provided in this embodiment in order to facilitate lateral transportation of heat. In this case, provision is made to transfer the heat from the first solenoid coil to the passive, non-current-carrying conductor track structure. This passive conductor track structure then allows the heat to be discharged to the surface or to the surfaces of the multi-layer printed circuit board. This transportation of heat to the surface or to the surfaces of the multi-layer printed circuit board is made easier by the passive conductor track structure not having to be insulated to the extent that would be required by the conductor tracks of the solenoid coil or of the solenoid coils.

In a particularly advantageous refinement of the disclosure, the transportation of heat from the passive conductor track structure to one or both surfaces can be made easier by the multi-layer printed circuit board having thermally conductive vias which vertically pass through the passive conductor track structure. These thermally conductive vias have the task of transporting the heat previously transported substantially laterally through the multi-layer printed circuit board in the vertical direction, for example to a heat sink which is arranged on the surface of the multi-layer printed circuit board.

Here, it is possible for a heat sink to be arranged on only one surface of the multi-layer printed circuit board. However, as an alternative, both surfaces of the multi-layer printed circuit board can be provided with a heat sink for the purpose of removing heat.

In one refinement of the disclosure, particularly good transfer of heat from the thermally conductive vias to the heat sink or heat sinks can be achieved by the thermally conductive vias being in contact with a heat sink which is arranged on a surface of the multi-layer printed circuit board. This is the case particularly when the solenoid coils which are arranged on the multi-layer printed circuit board are operated only at moderate voltages. A moderate voltage in this sense arises, for example, when the potential differences within the printed circuit board are no more than 150 V. In this case, it is not necessary to further insulate the thermally conductive vias upstream of the heat sink. Here, both surfaces of the multi-layer printed circuit board can also be provided with a heat sink for the purpose of removing heat. In this case, it is expedient for the thermally conductive vias to be in contact with both heat sinks.

However, if very high voltages are used within the multi-layer printed circuit board, an embodiment of the disclosure in which the multi-layer printed circuit board has an insulating covering layer which covers at least one flat coil, which is close to the surface, and the thermal vias is advantageous. An insulating covering layer of this kind may have to be provided on both surfaces of the multi-layer printed circuit board in order to ensure protection against impermissibly high contact voltages. A high-voltage in this sense arises, for example, when potential differences within the multi-layer printed circuit board can be more than 500 V.

It may be desirable to keep the insulating gap as low as possible particularly between two adjacent flat coils which are electrically connected to one another in parallel. This results, firstly, in optimum transportation of heat when implementing the teaching according to the disclosure. Secondly, the physical height of the multi-layer printed circuit board is not designed to be greater than necessary. In a refinement of the disclosure, a particularly thin insulating layer between two vertically adjacent flat coils can be ensured by planes of the multi-layer printed circuit board being mechanically connected to one another by a baked enamel layer which is situated between said adjacent flat coils. Here, a prepreg layer for separating the individual printed circuit boards which are vertically layered one above the other and on the top and bottom side of which at least one flat coil is fitted in each case is advantageously dispensed with.

A refinement of the disclosure in which an iron core passes through the first solenoid coil perpendicular to the surface of the multi-layer printed circuit board is advantageous, particularly when the multi-layer printed circuit board according to the disclosure is intended to be used as a primary part of a linear motor. If further solenoid coils are provided in addition to the first solenoid coil, it is advantageous for iron cores to pass through the further solenoid coils too.

BRIEF DESCRIPTION OF THE DRAWINGS

The disclosure will be explained in more detail below with reference to the exemplary embodiments illustrated in the figures,
in which.

DETAILED DESCRIPTION

Figure 1:
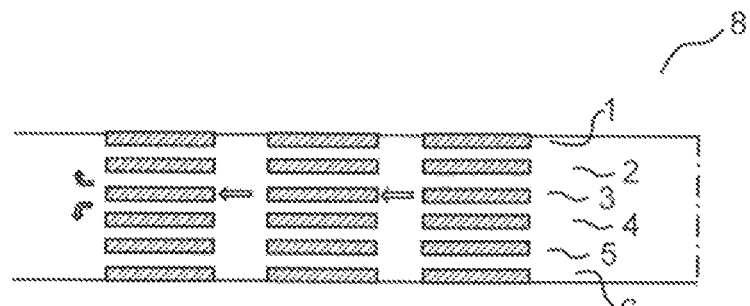
FIG. 1 shows a cross section through a multi-layer printed circuit board having a solenoid coil according to the prior art.

FIG. 1 shows a solenoid coil which is known from the prior art and is in the form of a multi-layer printed circuit board. The multi-layer printed circuit board is constructed from three individual printed circuit boards which are layered one above the other. Each of these three printed circuit boards has a spiral flat coil 1-6 both on the top side of the printed circuit board and also on the bottom side of the individual printed circuit board. Therefore, the topmost individual printed circuit board of the stack has a first flat coil 1 on its top side, three turns of said first flat coil which are arranged laterally next to one another being shown in the cross section 8. A second flat coil 2, the winding sense of which corresponds to that of the first flat coil 1, is located on the bottom side of this individual printed circuit board which forms the topmost plane of the stack.

A second individual printed circuit board, a third flat coil 3 being fitted on the top side of said second individual printed circuit board and a fourth flat coil 4 being arranged on the bottom side of said second individual printed circuit board, is located below said first plane which is formed by the first individual printed circuit board having the first flat coil 1 and the second flat coil 2. Said flat coils 3, 4 also correspond to the flat coils 1, 2 of the first plane in respect of their winding form. Finally, a further individual printed circuit board, a fifth flat coil 5 being arranged on the top side of said further individual printed circuit board and a sixth flat coil 6 being arranged on the bottom side of said further individual printed circuit board, is located on the bottommost plane of the multi-layer printed circuit board. In respect of the design of the winding, the fifth and the sixth flat coil 5, 6 correspond to the flat coils 1, 2, 3, 4 arranged above them.

During the manufacturing process, the individual printed circuit boards together with their associated flat coils 1-6 are manufactured first of all. Then, insulating prepreg layers, not illustrated here, are arranged between the various individual printed circuit boards, respectively lower flat coils of an individual printed circuit board 2, 4 being electrically insulated from the upper flat coils 3, 5, which are situated beneath them, of the individual printed circuit board, which is respectively arranged beneath said individual printed circuit board 2, 4, by said prepreg layers.

The conductor tracks of the various flat coils are generally composed of copper and are located on a printed circuit board substrate, such as FR4 for example, which forms the respective individual layer or individual printed circuit board. After the various substrates have been stacked one onto the other in a manner separated by one or two sheets of prepreg material in each case, the resulting overall stack is laminated in order to establish a mechanical connection between the substrates.

In order to form a solenoid coil from the various flat coils 1-6, the flat coils 1-6 have to be further electrically contact-connected to one another. This is generally done by electrical through-hole plating, so-called vias which are not illustrated in FIG. 1.

The conductor track sections of the various turns of each flat coil 1-6 have to be spaced apart from one another in the lateral direction to a sufficient extent in order to ensure electrical insulation between the individual turns. However, this electrical insulation path also has to be overcome when discharging heat which is produced in the inner turns of each flat coil 1-6 and can be discharged in the direction of the surface at the edge of the multi-layer printed circuit board. FIG. 1 shows, by way of example, the heat flow of that turn of the third flat coil 3 which is illustrated furthest on the inside. A gap between the conductor tracks in the lateral direction of the order of magnitude of a few hundred micrometers is produced solely for manufacturing reasons, particularly when the cross section of each conductor track is intended to be chosen to be large in order to be able to carry as high a current as possible. Therefore, it is clear that this electrical insulating gap constitutes an obstacle to the removal of heat from the multi-layer printed circuit board.

Figure 2:
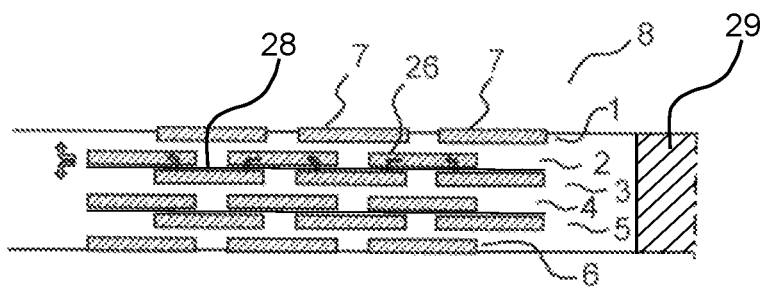
FIG. 2 shows a cross section through one embodiment of the multi-layer printed circuit board according to the disclosure in which a first solenoid coil is shown.

FIG. 2 shows a cross section 8 through one embodiment of the multi-layer printed circuit board according to the disclosure. In this case too, the multi-layer printed circuit board forms a solenoid coil which is formed by electrically interconnecting a total of six flat coils 1-6 which are arranged in planes which are situated vertically one above the other. In this case too, a first individual layer has the first flat coil 1 on its top side and the second flat coil 2 on its bottom side. Both flat coils 1, 2 were fitted onto a PCB substrate before the multi-layer stack was formed. The same applies to the third flat coil 3 and the fourth flat coil 4 which were likewise fitted onto a PCB substrate before the complete stack was manufactured. Similarly, the fifth flat coil 5 was fitted onto the top side of a third individual layer printed circuit board and the sixth flat coil 6 was fitted onto the bottom side of this individual printed circuit board.

However, in contrast to the prior art illustrated in FIG. 1, in each case two flat coils 1-6 which are immediately adjacent in the vertical direction are here arranged offset in relation to one another in the lateral direction. This ensures that, for example, each conductor track section 26 of the second flat coil 2 is arranged so as to vertically partially overlap two conductor track sections 7 of the first flat coil. Similarly, for example, the conductor track section of the third flat coil 3, which constitutes the middle turn, is arranged so as to partially overlap two conductor track sections of the second flat coil 2 which are situated one above the other as viewed in the vertical direction.

The marked arrows indicate how the transportation of heat from the inner turns of each flat coil 1-6 to the outer edge region of each flat coil 1-6 is improved by the lateral offset of the flat coils which are immediately adjacent in the vertical direction. By way of example, this is illustrated in FIG. 2 for the transportation of heat of the second and third flat coils 2, 3. Owing to the section-by section overlap region between two conductor track sections which are adjacent in the vertical direction, it is only further necessary for a considerably shorter distance to be bridged by electrically and therefore also thermally insulating material.

FIG. 2 also shows that the distance between the second flat coil 2 and the third flat coil 3 in the vertical direction is smaller than the distance between the first flat coil 1 and the second flat coil 2. Similarly, the distance between the fourth flat coil 4 and the fifth flat coil 5 is considerably smaller than the distance between the fifth flat coil 5 and the sixth flat coil 6. This can be attributed to the underlying connection technology between the individual layers already mentioned above. If only a very thin prepreg material or alternatively a pure baked enamel layer 28 is used for connecting the individual printed circuit boards, the insulating connecting layer between the individual printed circuit boards which are connected to form a stack can be chosen to be smaller than the thickness of the substrate on which the flat coils of each individual printed circuit board are arranged. In this context, baked enamel is an enamel which is cured by heat e.g. in order to bond surfaces together. It may also be referred to as bondable enamel. In this way, it is possible, provided that it allows the required electrical insulating gap, for the conduction of heat from the central inner region of the solenoid coil to the outer region of the solenoid coil to be improved even further.

Figure 3:
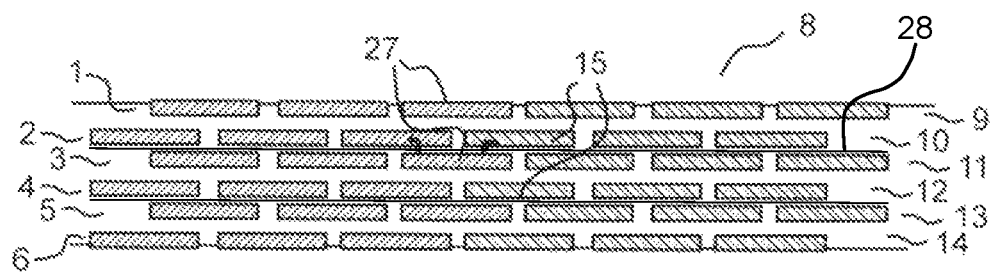
FIG. 3 shows a cross section through a further embodiment of the multi-layer printed circuit board according to the disclosure having two solenoid coils.

FIG. 3 shows a cross section 8 through an embodiment of a multi-layer printed circuit board according to the present disclosure, in which two solenoid coils are arranged laterally adjacent to one another on the multi-layer printed circuit board. The first solenoid coil, which is arranged on the left in the cross section 8, comprises three flat coils 1-6 which are situated vertically one above the other and are each arranged laterally offset in relation to one another in the manner already described in connection with FIG. 2. As viewed in the lateral direction, flat coils 1-6 of the first solenoid coil engage in a comb-like manner into a directly laterally adjacent second solenoid coil having flat coils 9-14. The engagement is made in the region of the respectively outer conductor track sections 27, 15. As shown, the comb-like engagement ensures that in each case one outer conductor track section 15 of the second solenoid coil is arranged so as to vertically partially overlap at least one outer conductor track section 27 of the first solenoid coil. This overlap allows transportation of heat between the two solenoid coils in question in a particularly effective manner. As shown, only the relatively small vertical distance between two outer conductor track sections, which are adjacent in the vertical direction, of the two solenoid coils also have to be overcome here in order to allow lateral transportation of heat.

In this way, a large number of solenoid coils can be arranged on a multi-layer printed circuit board next to one another as viewed in the lateral direction and, in the process, outstanding transportation of heat in the multi-layer printed circuit board in the lateral direction can be ensured, this resembling the thermal behavior of a solid metal layer.

Figure 4:
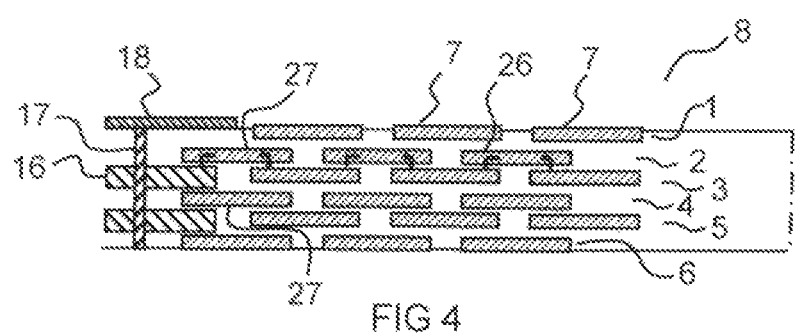
FIG. 4 shows a cross section through a further embodiment of the multi-layer printed circuit board according to the disclosure having a first solenoid coil and a passive conductor track structure.

FIG. 4 shows a further embodiment of a multi-layer printed circuit board according to the present disclosure in a cross section 8. Said figure once again shows six flat coils 1-6 of a first solenoid coil which are situated vertically one above the other. The arrangement of the flat coils 1-6 corresponds substantially to the arrangement which has already been explained in connection with FIG. 2. The left-hand region of the cross section 8 shows a passive conductor track structure 16 which engages in a comb-like manner into the outer conductor track sections 27 of the first solenoid coil. This passive conductor track structure 16 has no current flow, that is to say it is DC-isolated from all of the current-carrying elements of the multi-layer printed circuit board. The passive conductor track structure 16 has the task of transporting the heat conducted through the multi-layer printed circuit board in lateral direction in the manner described above in a very effective manner vertically to one or both surfaces of the multi-layer printed circuit board.

By way of example, a heat sink 18 by means of which the heat is finally emitted to the surrounding area is arranged on one of said surfaces. It goes without saying that a heat sink 18 of this kind can additionally even be located on the bottom side of the illustrated multi-layer printed circuit board. In order to now transport the heat in an optimum manner from the passive conductor track structure 16 in the direction of the heat sink 18 in the vertical direction, thermally conductive vias 17 pass through the passive conductor track sections 16. Said thermally conductive vias may be, for example, bores which are then filled with a highly thermally conductive material. Since the conductor track structure 16 is not electrically active, the short circuit, which is caused by the thermally conductive vias, between the individual conductor tracks of the passive conductor track structure 16 is not harmful.

As shown in FIG. 4, the illustrated thermally conductive via 17 is in direct contact with the heat sink 18. This results in a virtually ideal thermal conduction behavior between the passive conductor track structure 16 and the heat sink 18. However, if a relatively high voltage were applied to the solenoid coil, the insulating gap between the outer conductor track sections 27 of the solenoid coil and the passive conductor track structure 16 may not be sufficient in order to ensure adequate protection against contact.

Figure 5:
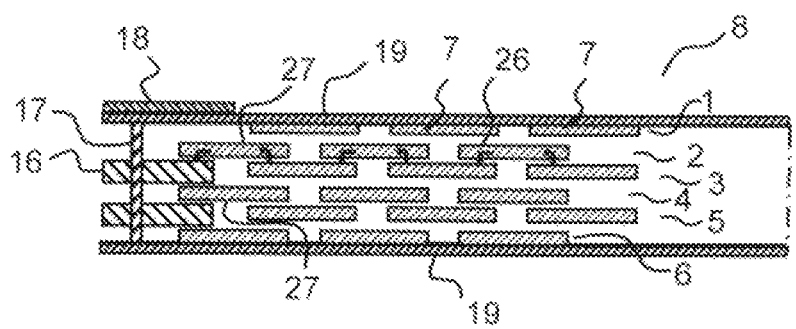
FIG. 5 shows a cross section through a further embodiment of the multi-layer printed circuit board having the first solenoid coil according to FIG. 4 and the passive conductor track structure.

Therefore, a further embodiment of the disclosure which is illustrated in FIG. 5 may be recommended for high-voltage applications. By way of example, one application of this is in a converter with a DC voltage intermediate circuit and an intermediate circuit voltage of 750 V. The design corresponds substantially to that cross section 8 already shown in FIG. 4, but with an insulating prepreg layer 19 now having been applied between the heat sink 18, the conductor tracks of the topmost first flat coil 1 and the thermal via 17. Similarly, an insulating layer 19 of this kind is located on the bottom side of the printed circuit board on which a further heat sink, not illustrated here, can likewise optionally also be located. The prepreg layer is chosen to be thin enough in order to not excessively prevent the transportation of heat from the thermally conductive via 17 to the heat sink 18. However, at the same time, it is chosen to be so thick that adequate protection against contact is ensured for the multi-layer printed circuit board. A completely smooth surface of the printed circuit board is produced by the prepreg layer 19 on both surfaces of the multi-layer printed circuit board.

Figure 6:
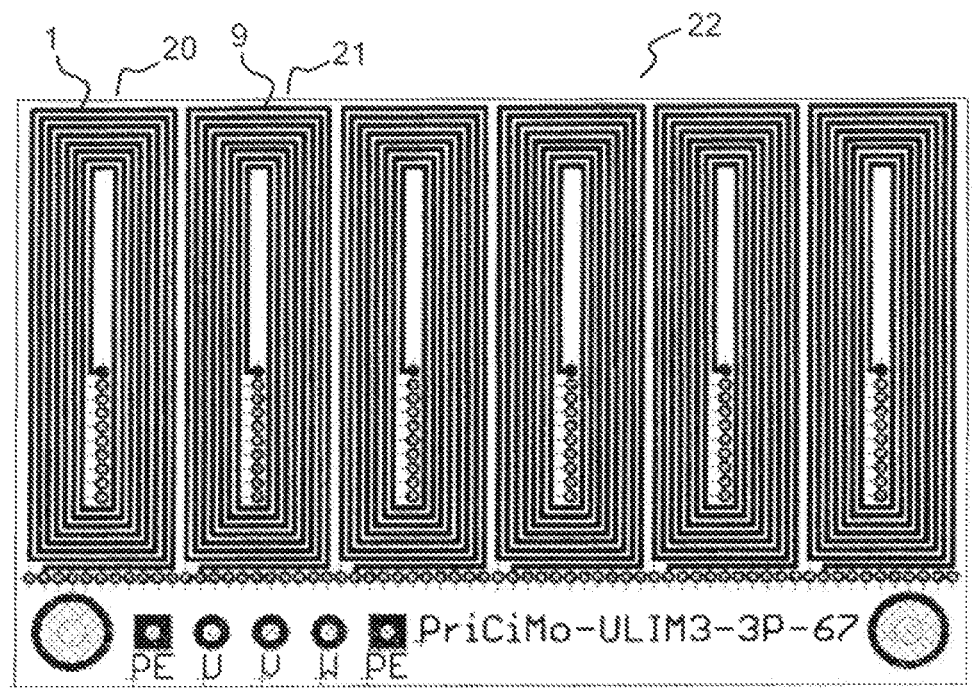
FIG. 6 shows a plan view of an embodiment of the multi-layer printed circuit board according to the disclosure having six laterally adjacent solenoid coils.

FIG. 6 shows a plan view of one embodiment of the multi-layer printed circuit board according to the disclosure. The multi-layer printed circuit board serves as a primary part 22 of a linear motor. In addition to a first solenoid coil 20 and a second solenoid coil 21, four further physically identical solenoid coils are located laterally next to the abovementioned coils. Each individual solenoid coil is designed such that it has the lateral offset according to the disclosure of the adjacent flat coils as viewed in the vertical direction. Furthermore, the respectively outermost conductor track sections of each solenoid coil engage in a comb-like manner into the outermost conductor track sections of the immediately laterally adjacent solenoid coil, wherein this engagement is realized in the manner illustrated in FIG. 3. This ensures, in the lateral direction, a thermal conductance within the multi-layer printed circuit board between the individual solenoid coils which resembles that of a solid metal plate.

Figure 7:
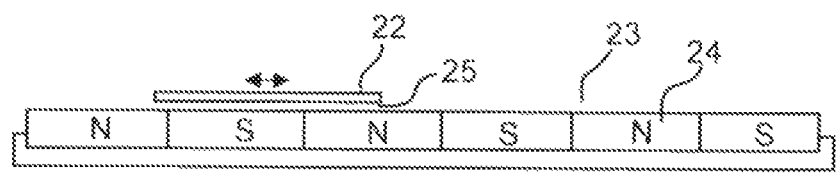
FIG. 7 is a schematic illustration of a linear motor, the primary part of which is realized in the form of an embodiment of the multi-layer printed circuit board according to the disclosure.

FIG. 7 schematically shows a linear motor comprising a primary part 22 which can be designed as a multi-layer printed circuit board like that shown in FIG. 6. A primary part 22 of this kind is very compact and lightweight, so that it is particularly well suited to highly dynamic applications. This primary part 22 electromagnetically interacts with a secondary part 23. The secondary part comprises permanent magnets 24 which are embedded in a soft-iron bed. The primary part 22 and the secondary part 23 are spaced apart from one another by means of an air gap 25. A translatory highly dynamic movement of the primary part 22 can be realized by suitably energizing the solenoid coils present in the primary part 27.

LIST OF REFERENCE SYMBOLS

1 First flat coil
2 Second flat coil
3 Third flat coil
4 Fourth flat coil
5 Fifth flat coil
6 Sixth flat coil
7 Conductor track section
8 Cross section
9-14 Flat coils of the second solenoid coil
15 Outer conductor track sections of the second solenoid coil
16 Passive conductor track section
17 Thermally conductive vias
18 Heat sink
19 Insulating covering layer
20 First solenoid coil
21 Second solenoid coil
22 Primary part
23 Secondary part
24 Permanent magnet
25 Air gap
26 Conductor track section
27 Outer conductor track section
28 Baked enamel layer
29 Iron core

The invention claimed is:

1. A multi-layer printed circuit board comprising:
flat coils which are situated vertically one above the other and are connected electrically in series or in parallel in order to form a first solenoid coil; wherein:
two vertically adjacent flat coils are arranged laterally offset in relation to one another in such a way that conductor track sections of one flat coil are arranged so as to vertically partially overlap with two conductor track sections of the other flat coil in a cross section perpendicular to a surface of the multi-layer printed circuit board;
the multi-layer printed circuit board has at least one second solenoid coil which is arranged laterally offset in relation to the first solenoid coil; and
outer conductor track sections of flat coils of the second solenoid coil engage in a comb-like manner into outer conductor track sections of the flat coils of the first solenoid coil, so that in each case one outer conductor track section of the second solenoid coil is arranged so as to vertically partially overlap with at least one outer conductor track section of the first solenoid coil in said cross section.

2. The multi-layer printed circuit board as claimed in claim 1, wherein the multi-layer printed circuit board has a passive conductor track structure which is DC-isolated from all current-carrying conductor tracks of the multi-layer printed circuit board, is arranged laterally offset in relation to the first solenoid coil, and engages in a comb-like manner into outer conductor track sections of the flat coils of the first solenoid coil.

3. The multi-layer printed circuit board as claimed in claim 2, wherein thermally conductive vias vertically pass through the passive conductor track structure.

4. The multi-layer printed circuit board as claimed in claim 3, wherein the thermally conductive vias are in contact with a heat sink which is arranged on a surface of the multi-layer printed circuit board.

5. The multi-layer printed circuit board as claimed in claim 3, wherein the multi-layer printed circuit board has an insulating covering layer which covers at least one flat coil and the thermally conductive vias.

6. The multi-layer printed circuit board as claimed in claim 1, wherein planes of the multi-layer printed circuit board are mechanically connected to one another by a baked enamel layer which is situated between adjacent flat coils.

7. The multi-layer printed circuit board as claimed in claim 1, wherein an iron core passes through the first solenoid coil perpendicular to the surface of the multi-layer printed circuit board.

8. A linear motor comprising a primary part, which is in the form of a multi-layer printed circuit board as claimed in claim 1, and a secondary part having permanent magnets which is spaced apart from the primary part by an air gap.

* * * * *